United States Patent [19]

Mikkor et al.

[11] Patent Number: 4,808,549

[45] Date of Patent: Feb. 28, 1989

[54] METHOD FOR FABRICATING A SILICON FORCE TRANSDUCER

[75] Inventors: Mati Mikkor, Ann Arbor; Edward N. Sickafus, Grosse Ile, both of Mich.

[73] Assignee: Ford Motor Company, Dearborn, Mich.

[21] Appl. No.: 199,892

[22] Filed: May 27, 1988

[51] Int. Cl.[4] .................. H01L 27/20; H01L 21/70
[52] U.S. Cl. .................................. 437/60; 437/901;
  437/919; 437/226; 437/228; 156/647;
  204/129.3; 148/DIG. 12
[58] Field of Search ............ 437/901, 919, 921, 226,
  437/228, 60; 156/647; 204/129.3; 148/DIG. 12

[56] References Cited

U.S. PATENT DOCUMENTS

| | | | |
|---|---|---|---|
| 4,071,838 | 1/1978 | Block | 156/647 |
| 4,144,516 | 3/1979 | Aine | 338/2 |
| 4,495,820 | 1/1985 | Shimada et al. | 73/724 |
| 4,665,610 | 5/1987 | Barth | 29/580 |
| 4,670,969 | 6/1987 | Yamada | 148/DIG. 12 |
| 4,773,972 | 9/1988 | Mikkor | 148/DIG. 12 |

*Primary Examiner*—Brian E. Hearn
*Assistant Examiner*—Tuan Nguyen
*Attorney, Agent, or Firm*—Allan J. Lippa; Peter Abolins

[57] ABSTRACT

A silicon substrate having {100} nominal crystalline planes is anisotropically etched to form a pair of V-shaped grooves along the top planar surface and a first plate between the grooves. The top planar surface is then doped to form a conductor region including the first plate. A substantially uniform layer of a selectively etchable material, such as silicon oxide, is then grown over the grooved top planar surface. A layer of doped silicon is grown over the silicon oxide layer to define a pair of V-shaped members opposite the pair of grooves. The silicon layer is then partially etched to form a second plate connected to the silicon layer through a pair of V-shaped members. Both the second plate and the pair of V-shaped members are then suspended over the first capacitive plate by sacrificially etching a portion of the selectively etchable layer. Electronic circuitry is then coupled to both the doped silicon layer and the doped substrate to detect changes in capacitance between the first and second plates in response to an applied force, such as airflow, to be measured.

13 Claims, 4 Drawing Sheets

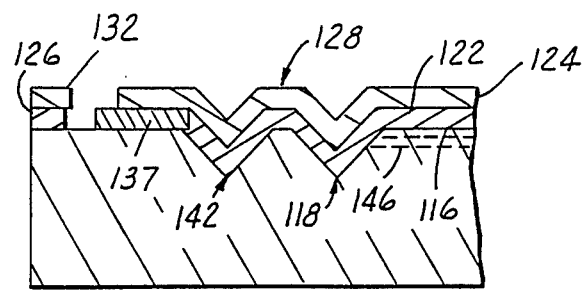
FIG.4F
FIG.5
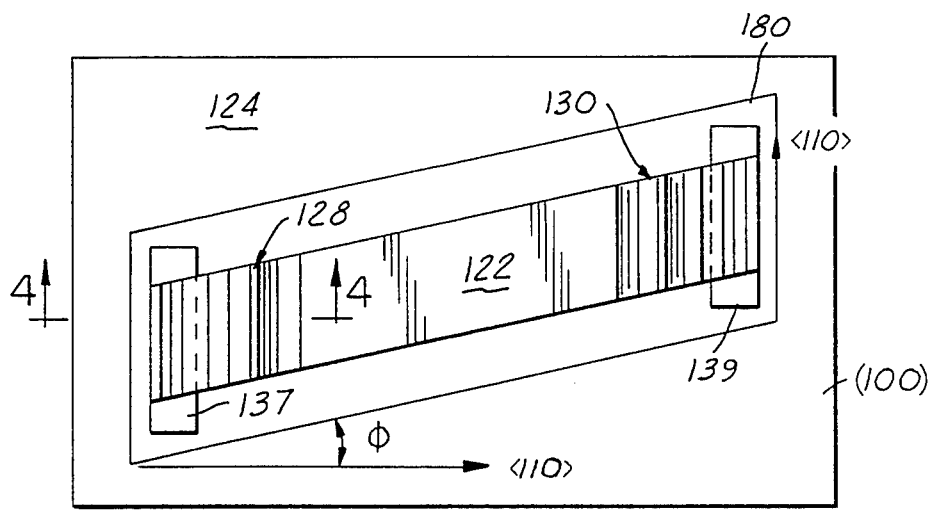

METHOD FOR FABRICATING A SILICON FORCE TRANSDUCER

BACKGROUND OF THE INVENTION

The field of the invention relates to force transducers fabricated from silicon.

It is known to fabricate force transducers of the parallel plate capacitive type by etching a flexible plate or diaghragm from a silicon substrate and bonding the substrate to a second parallel substrate with an insulating spacer therebetween. Conventional electronic circuitry is employed to measure the change in capacitance resulting from flexure or bending of the diaphragm thereby providing an approximation of the force applied against the diaphragm. An example of this type of transducer is disclosed in U.S. Pat. No. 4,495,820. A problem with this type of approach is that the diaphragm must be sufficiently thick to avoid either fracture or contact between the plates thereby limiting the sensitivity of the device. Stated another way, since sensitivity is inversely related to diaphragm thickness, and the diaphragm must be sufficiently thick to avoid both fracture and plate contact, there is a limit on the device sensitivity. Another problem is that because the diaphragm flexes or bends, deflection of the diaphragm is not rectilinear in response to the applied force. Thus, the required translation of diaghragm deflection into a measurement of the applied force is complicated. Still another problem is the fabricating complexity of bonding together two separate structures.

U.S. Pat. No. 4,144,516 issued to Aine discloses adjacent folded cantilever leaf springs etched from a silicon substrate wherein leaf spring deflection is, allegedly, linearly proportional to the applied force. The disclosed device however still requires multiple substrates to be bonded together and it also appears to have limited sensitivity.

U.S. Pat. No. 4,665,610 issued to Barth discloses a pressure transducer having multiple level diaphragms formed by etching a selectively etchable material, or spacer, between the diaphragm levels. This approach does not appear to provide rectilinear displacement of the diaghragm in response to the applied force. Another disadvantage is the inherent complexity in fabricating the multiple level diaphragms.

SUMMARY OF THE INVENTION

An object of the invention is to provide a method for fabricating a force transducer from a single silicon substrate having parallel capacitive plates wherein plate movement is more nearly rectilinear in response to an applied force and the sensitivity of plate movement with respect to the applied force is greater than heretofore possible.

The above problems and disadvantages are solved, and object achieved, by providing a method for fabricating a force transducer from a single silicon substrate having parallel plates to measure the change in capacitance therebetween in response to an applied force wherein the movement of the plates is rectilinear in response to the applied force. In one aspect of the invention, the method includes the steps of: anisotropically etching parallel grooves along a top planar surface of a silicon substrate forming a first plate between the parallel grooves, preferably the silicon substrate has a {100} nominal plane so that the parallel grooves are V-shaped having side walls lying in the {111} planes; doping the top planar surface to form a conductive region, thereby rendering the first plate conductive without having to deposit a separate conducting plate on the top planar surface; forming a substantially uniform layer of a selectively etchable material over the grooved top planar surface; forming a substantially uniform layer of doped silicon over the layer of selectively etchable material following the contour of the grooved top planar surface to define a pair of corrugations opposite the pair of grooves and a second plate between the pair of corrugations, the corrugations preferably being V-shaped; etching a pair of openings through the silicon layer such that the second plate is connected to the silicon layer only through the pair of corrugations; applying a selective etchant through the pair of openings etching only the selectively etchable layer to suspend the second plate and the pair of corrugations over the top planar surface; and coupling detecting circuitry to both the silicon layer and the substrate to detect capacitive changes between the first plate and the second plate in response to the applied force.

The novel corrugations enhance plate deflections by the opening and closing of the corrugations. Thus, deflection of the plate is no-longer limited by the amount of flexing or bending the plate is able to withstand as is the case of prior approaches. The sensitivity of plate deflection may be further increased by increasing the number of corrugations. In addition, since the corrugations are not constrained to be in a single plane, a large number of corrugations are obtained in a compact device. Advantages are thereby obtained of providing a force transducer having greater sensitivity and requiring less space than heretofore possible.

The symmetrically placed corrugations with respect to the first plate also provide for a more nearly rectilinear deflection of the plate in response to an applied force as compared with prior approaches. An advantage is thereby obtained of having a simple correlation between capacitive changes and the applied force.

Another advantage is that the entire structure is fabricated from a single silicon substrate. Thus, the problems of prior approaches wherein multiple substrates had to be bonded together, and the associated complexity in fabrication, are avoided by the invention described herein.

Still another advantage is that each plate is fabricated directly from a doped silicon material. An advantage is thereby obtained of eliminating the prior need of bonding conducting plates to a silicon substrate. A further advantage is that a separate insulator does not have to be bonded between two separate substrates.

BRIEF DESCRIPTION OF THE DRAWINGS

The invention will now be further described by way of example, with reference to the accompanying drawings, in which:

FIGS. 4A–4F illustrate various fabricating steps for fabricating an alternate embodiment in which the invention is used to advantage; and FIG. 5 is a top planar view of the embodiment fabricated by the steps illustrated in FIGS. 4A–4F.

DESCRIPTION OF THE PREFERRED EMBODIMENT

Figure 1:
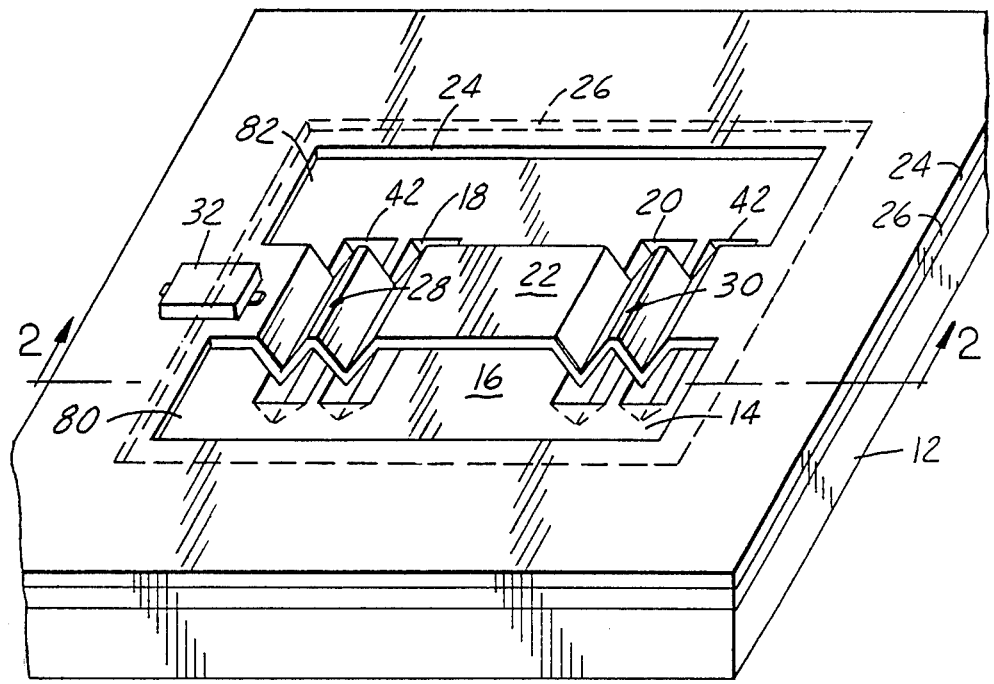
FIG. 1 is a perspective view of an embodiment in which the invention is used to advantage.
Figure 2:
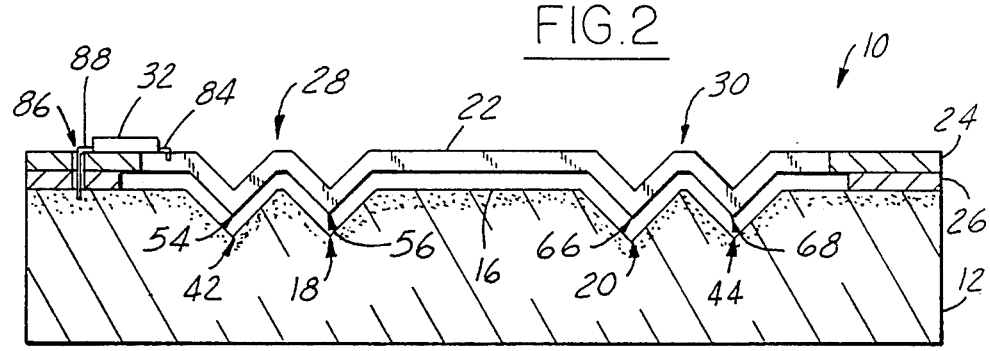
FIG. 2 is a cross-sectional view taken along line 2—2 of FIG. 1.

Referring to FIGS. 1 and 2, in general terms, force transducer 10 is shown in this example fabricated from a p-silicon substrate 12 having a top planar surface 14. Force transducer 10 includes first capacitive plate 16, shown as a portion of top planar surface 14 between V-grooves 18 and 20, and second capacitive plate 22, shown as a portion of p-doped polysilicon layer 24 suspended by corrugations 28 and 30. Top planar surface 14 and polysilicon layer 24 are shown separated by an insulator, silicon oxide layer 26 in this example. Both plate 16 and plate 22 are conductors fabricated from p-doped silicon as described in greater detail hereinafter. Electronic circuitry 32, in a conventional manner, measures the capacitive change between plates 16 and 22 which results from a deflection in plate 22 by an applied force.

Corrugations 28 and 30 provide deflection of plate 22 by the accordian-like action of opening and closing in response to the applied force. Thus, movement of plate 22 occurs essentially by deflection of the corrugations rather than by flexure or bending of the plate itself. It is noted that the sensitivity of plate movement in response to the applied force is easily increased by increasing the number of corrugations. Further, since the corrugations are not constrained to be in a single plane, a large number of corrugations are obtained in a compact device. Advantages are thereby obtained of providing a force transducer having greater sensitivity and requiring less space than heretofore possible.

Corrugations 28 and 30 are also symmetrically positioned about plate 22. Therefore, plate 22 remains nearly planar regardless of the force applied. Stated another way, movement of plate 22 is rectilinear in response to the applied force. Translation of capacitance changes to a measurement of force is thereby simplified.

Figure 3A:
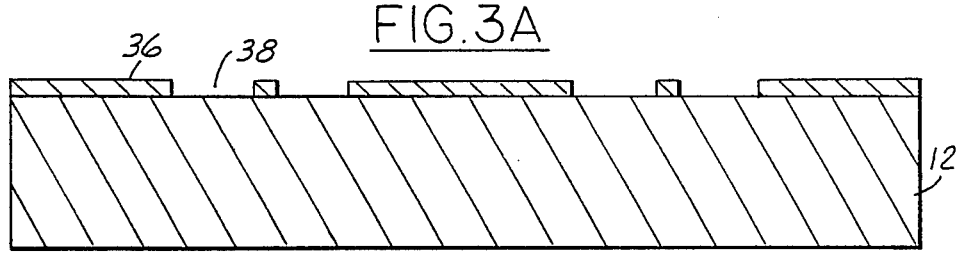
FIGS. 3A–3E illustrate various fabricating steps for fabricating the embodiment shown in FIG. 2.

Now referring to FIGS. 3A through 3F, an example of fabrication of force transducer 10 is presented. In FIG. 3A, silicon substrate 12, having {100} nominal planes, is shown with a conventional silicon oxide mask 36 formed on top planar surface 14 by conventional photolithographic techniques. Mask 36 is shown having transverse openings 38 etched therethrough.

Figure 3B:
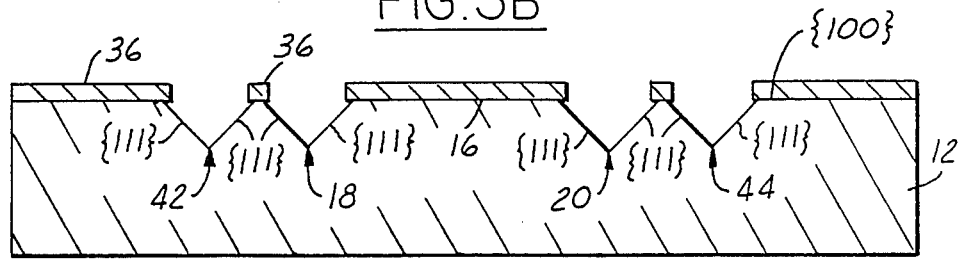

Referring to FIG. 3B, an anisotropic etchant, such as aqueous potassium hydroxide or ethylene diamine pyrocatecol and water solutions, is applied to openings 38 for forming first pair of V-grooves 18 and 20, and second pair of V-grooves 42 and 44. First pair of V-grooves 18 and 20 define a portion of capacitive plate 16 therebetween. The anisotropic etchant acts against the {100} nominal planes at a rate approximately 40 times greater than it acts against the intersecting {111} planes. Accordingly, V-grooves 18, 20, 42 and 44 are essentially defined by side walls lying in the {111} planes.

Figure 3C:
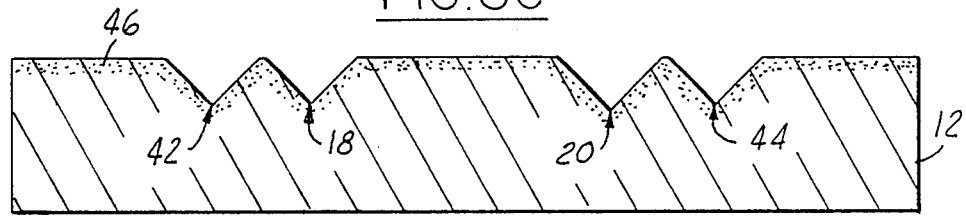

After the anisotropic etch step, mask 36 is chemically removed, in this example, by an etchant which acts against silicon oxide such as buffered hydroflouric acid. Substrate 12 is then surface-doped, with boron in this example, to form a p+ conductor region 46 (FIG. 3C). In this manner, plate 16 becomes a conductive capacitor plate and the need for depositing a separate conductive plate on top planar surface 16 is eliminated. Further, since conductor region 46 extends along the entire top planar surface 14, the need for separate conductive traces to interconnect plate 16 with electronics circuitry 32 is eliminated.

A selectively etchable layer 26 (FIG. 3D), silicon oxide in this example, is formed over grooved planar surface 14. Although selectively etchable layer 26 comprises a conventionally oxidized layer of silicon oxide in this example, it is to be noted that other selectively etchable materials may be used to advantage.

Figure 3D:
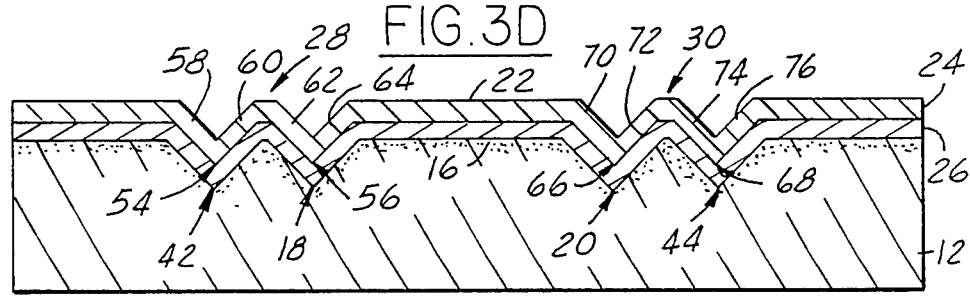

Continuing with FIG. 3D, p+ polysilicon layer 24 is deposited over selectively etchable layer 26 by use of conventional chemical vapor deposition techniques. It is noted that polysilicon layer 24 follows the contour of grooved planar surface 14 thereby forming corrugations 28 and 30, and second capacitive plate 22 therebetween. More specifically, corrugation 28 is shown in this example as the combination of V-shaped members 54 and 56 opposite respective V-grooves 42 and 18. V-shaped member 54 is shown defined by legs 58 and 60 positioned parallel to the side walls of V-groove 40. V-shaped member 56 is shown defined by legs 62 and 64 positioned parallel to the side walls of V-groove 18. Similarly, corrugation 30 is shown in this example as the combination of V-shaped members 66 and 68 opposite respective V-grooves 20 and 44. V-shaped member 66 is shown defined by legs 70 and 72, and V-shaped member 68 is shown defined by legs 74 and 76.

Figure 3E:
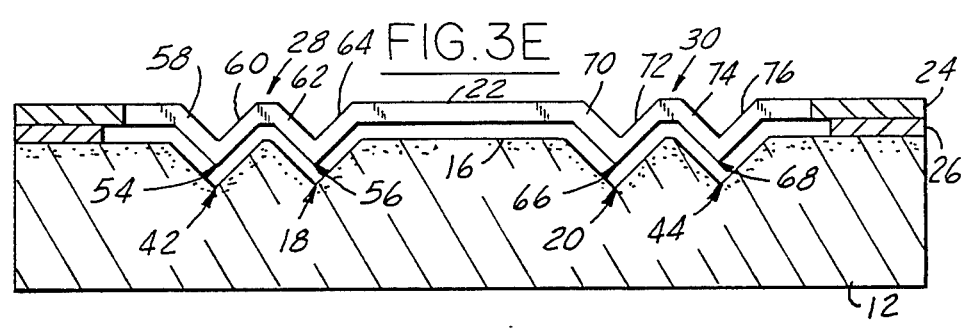

With reference to FIGS. 1, 2 and 3E, rectangular openings 80 and 82 are etched through polysilicon layer 24 in a longitudinal direction by an etchant, such as aqueous potassium hydroxide solution or ethylene diamine pyrocatecol and water solutions, thereby forming the transverse dimensions of plate 22, and corrugations 28 and 30. The anisotropic etchant does not act against selectively etchable layer 26.

An etchant which acts against selectively etchable layer 26, in this example an oxide etchant, such as buffered hydroflouric acid, is then applied through openings 80 and 82 for a predetermined time. More specifically, the oxide etching step is timed such that silicon oxide layer 26 is sufficiently etched to suspend both plate 22 and the pair of corrugations 28 and 30 while leaving a spacer, or insulator, between polysilicon layer 24 and substrate 12.

It is noted that corrugations 28 and 30 react in an accordian-like manner when a force to be measured, such as airflow, is applied to capacitive plate 22. For example, in response to the applied force, V-shaped members 54 and 56 of corrugation 28, and V-shaped members 66 and 68 of corrugation 30, open or close thereby enabling displacement of capacitive plate 22 without flexure of capacitive plate 22. Further, corrugations 28 and 30 are symmetrically positioned around capacitive plate 22. Thus, the opening and closing of both corrugation 28 and corrugation 30 in response to the applied force is virtually the same. Accordingly, displacement of capacitive plate 22 is nearly rectilinear in response to the applied force.

Referring to FIG. 2, conventional electronic circuitry 32 is shown connected, by conventional hybrid techniques, to both capacitive plate 16 and capacitive plate 22 by, respectively, p+ doped conductive region 46 and p+ doped polysilicon layer 24. Electronic circuitry 32 comprises conventional circuitry for measuring capacitive changes such as, for example, a capacitor bridge. Since both conductive region 46 and polysilicon layer 24 are p+ doped, conventional conductive strips, such as metal traces, between electronic circuitry 32 and both capacitive plates 16 and 22 are not needed.

More specifically, electronic circuitry 32 is shown connected to capacitive plate 22 via a conductive lead, preferably aluminum, diffused into polysilicon layer 24. Similarly, electronic circuitry 32 is shown coupled to capacitive plate 16 via a conventional hole 86 formed through both polysilicon layer 24 and selectively etchable layer 26, and conductive trace 88 shown diffused into conductive region 46.

An alternate embodiment is disclosed in FIGS. 4A–4F wherein the invention is used to advantage. In general terms, force transducer 110 is shown in this example fabricated from an n-silicon substrate 112 with a selectively etchable layer, shown as a p-epitaxial layer, and a top silicon layer shown as a n-epitaxial layer. An advantage of this embodiment is that the top silicon layer is crystalline due to interaction with the silicon substrate through the p-epitaxial layer which is also crystalline. On the other hand, since the selectively etchable layer of the preceding embodiment is silicon oxide, interaction between the top silicon layer and substrate is prohibited resulting in a polycrystalline layer. An advantage of having a crystalline top layer is that electronic circuitry may be fabricated within the top layer without the need for hybrid techniques. A more detailed description for fabricating force transducer 110 is described hereinbelow.

Figure 4A:
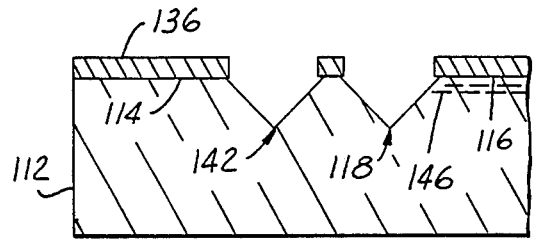
Figure 4B:
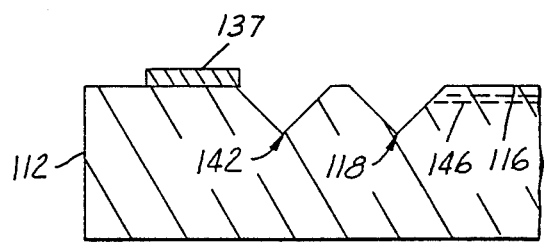

Referring to FIG. 4A, n-silicon wafer, having {100} nominal planes is shown having silicon oxide mask 136 formed thereon. In a conventional manner similar to that described in the previous embodiment, V-grooves 118, 120 (not shown), 142, and 144 (not shown) are anisotropically etched into substrate 112 forming corrugations 128 and 130 (not shown), and also forming capacitive plate 116 between corrugations 118 and 120. That portion of substrate 112 which defines capacitive plate 116 is shown highly doped with an n-type impurity such as phosphorus or arsenic. As shown in FIG. 4B, silicon oxide pads 137 and 139 (not shown) are formed by removing the appropriate portions of mask 136 by conventional photolithographic techniques.

Figure 4C:
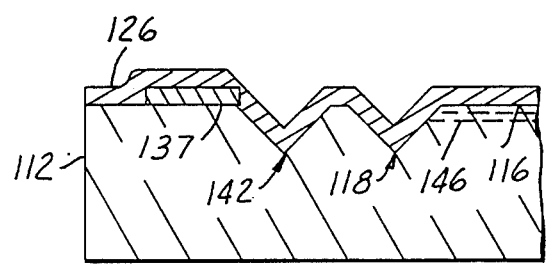
Figure 4D:
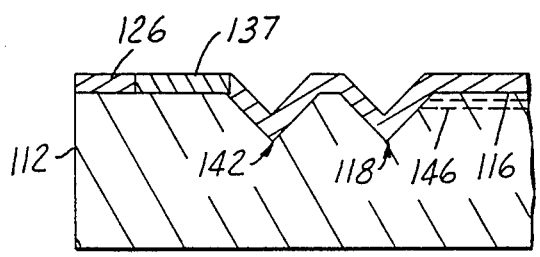

Referring to FIG. 4C, the selectively etchable layer is shown in this example as p-epitaxial layer 126 grown over substrate 112 and pads 137 and 139 (not shown) by low pressure chemical vapor deposition techniques (as described in A. C. Ipri, L. Jastrqebski and J. F. Corboy, proceedings, IEDM 82, p. 437). As shown in FIG. 4D, the portion of p-epitaxial layer 126 over pad 137 and pad 139 (not shown) is removed by conventional photolithographic and etching techniques.

Figure 4E:
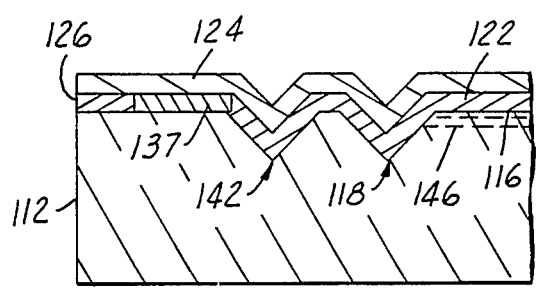

In FIG. 4E, top silicon layer, shown as n-epitaxial layer 124 in this example, is grown over p-epitaxial layer 126 and pad 137 and pad 139 (not shown) by low pressure chemical vapor deposition techniques.

Those skilled in the art will recognize that both p-epitaxial layer 126 and n-epitaxial layer 124 will have the same crystalographic orientation as substrate 112. Since both layers 124 and 126 have the same crystalographic orientation, a difficulty is presented in selectively etching layer 126 under layer 124 for suspending plate 122. This difficulty is overcome by the etchant steps described hereinbelow with particular reference to FIG. 5 and FIG. 4F.

In FIG. 5, etchant opening 180 is shown anisotropically etched through n-epitaxial layer 124. Opening 180 is shown having longitudinal directions parallel to the <110> crystal direction of the {100} substrate. Then using an electrochemical etching step (as described in Bell Systems Technical Journal, March 1970, Vol. 49, p. 473, by H. A. Waggener) n-epitaxial layer 124 and substrate 112 are biased positively (in a voltage range of 0.6 v to 1.0 v) and p-epitaxial layer 126 is at the voltage return. With the voltage bias as herein described, an anisotropic etchant, such as aqeuous solution of KOH is applied to opening 180 to selectively etch a sufficient portion of p-epitaxial layer 126 to suspend both capacitive plate 122 and convolutions 128 and 130 (not shown) above substrate 112. It is noted that by orienting the longitudinal direction of opening 180 along some desired angle $\Phi$ with respect to the <110> direction, selective etching of p-epitaxial layer 126 is enabled until intersection with the {111} planes of layer 126.

Since the top layer is crystalline, electronic circuitry 132 is fabricated directly within top layer 124 by conventional microelectronic techniques. Those skilled in the art will recognize that electronic circuitry 132 may be interconnected with capacitive plates 116 and 122 via electrically conductive strips formed by conventional deposition of appropriate insulators (not shown) and diffusion of appropriate metals (not shown).

This concludes the description of the preferred embodiment. The reading of it by those skilled in the art will bring to mind many alterations and modifications without departing from the spirit and scope of the invention. For example, the symmetrical pair of corrugations which provides rectilinear movement of plate 22 may each comprise either single V-shaped members or multiple V-shaped members. As another example, capacitive plate 22 may totally comprise a plurality of corrugations. Accordingly, it is intended that the scope of the invention be limited only by the following claims.

We claim:

1. A method for fabricating a force transducer having parallel plates to measure the change in capacitance therebetween in response to an applied force wherein the movement of the plates is rectilinear in response to the applied force, said method comprising the steps of:
   anisotropically etching a pair of parallel grooves along a top planar surface of a silicon substrate forming a first plate between said parallel grooves;
   doping said top planar surface to form a highly conductive region along said top planar surface;
   forming a substantially uniform layer of a selectively etchable material over said grooved top planar surface;
   forming a substantially uniform layer of doped silicon over said layer of selectively etchable material following the contour of said grooved top planar surface to define a pair of convolutions opposite said pair of grooves and a second plate between said pair of convolutions;
   etching a pair of openings through said silicon layer such that said second plate is connected to said silicon layer only through said pair of convolutions;
   applying a selective etchant through said pair of openings etching only said selectively etchable layer to suspend said second plate and said pair of convolutions over said top planar surface; and
   coupling detecting circuitry to both said silicon layer and said substrate to detect capacitive changes between said first plate and said second plate in response to the applied force.

2. The method recited in claim 1 further comprising the steps of etching a second pair of grooves along said top planar surface, each of said second pair of grooves being adjacent to one of said first pair of parallel grooves.

3. The method recited in claim 2 wherein each of said pair of convolutions is opposite both one of said first pair of parallel grooves and one of said second pair of parallel grooves.

4. The method recited in claim 1 wherein said doping step comprises doping said top planar surface with boron to form a p-type semiconductor region along said top planar surface.

5. The method recited in claim 4 wherein said step of forming said layer of selectively etchable material comprises oxidizing said grooved top planar surface to form a layer of silicon oxide thereon.

6. The method recited in claim 4 wherein said step of forming said layer of selectively etchable material comprises growing a silicon layer of n-type material thereon.

7. The method recited in claim 1 wherein said step of coupling said detecting circuitry comprises the steps of:
   evaporating a first conductor onto said silicon layer;
   evaporating a second conductor into said semiconductor region of said substrate; and
   connecting both said first conductor and said second conductor to said detecting circuitry.

8. A method for fabricating a force transducer having parallel plates to measure the change in capacitance therebetween in response to an applied force wherein the movement of the plates is rectilinear in response to the applied force, said method comprising the steps of:
   preparing a silicon substrate having nominal crystalline planes and a top planar surface substantially parallel to said nominal planes;
   anisotropically etching a pair of V-shaped parallel grooves along said top planar surface forming a first plate between said parallel grooves, each of said V-shaped grooves having side walls lying substantially in the {111} monocrystalline planes;
   doping said top planar surface to form a conductor region along said top planar surface;
   forming a substantially uniform layer of a selectively etchable material over said grooved top planar surface;
   forming a substantially uniform layer of doped silicon over said layer of selectively etchable material following the contour of said grooved top planar surface to define a pair of V-shaped members opposite said pair of grooves and a second plate between said pair of V-shaped members;
   etching a pair of openings through said silicon layer such that said second plate is connected to said silicon layer only through said pair of V-shaped members;
   applying a selective etchant through said pair of openings etching only said selectively etchable layer to suspend said second plate and said pair of V-shaped members over said top planar surface; and
   coupling detecting circuitry to both said silicon layer and said substrate to detect capacitive changes between said first plate and said second plate in response to the applied force.

9. The method recited in claim 8 wherein said doping step comprises doping said top planar surface with boron to form a p-type semiconductor region along said top planar surface.

10. The method recited in claim 9 wherein said step of forming said layer of selectively etchable material comprises oxidizing said grooved top planar surface to form a layer of silicon oxide thereon.

11. The method recited in claim 8 wherein said step of coupling said detecting circuitry comprises the steps of:
   sputtering a first conductor onto said epitaxial layer;
   sputtering a second conductor onto said semiconductor region of said substrate; and
   connecting both said first conductor and said second conductor to said detecting circuitry.

12. The method recited in claim 8 further comprising the steps of etching a second pair of parallel V-shaped grooves along said top planar surface, each of said second pair of V-shaped grooves being adjacent to one of said first pair of V-shaped grooves, each of said second pair of grooves having side walls lying in the {111} monocrystalline planes.

13. A method for fabricating a force transducer having parallel plates to measure the change in capacitance therebetween in response to an applied force wherein the movement of the plates is rectilinear in response to the applied force, said method comprising the steps of:
   preparing a n-silicon substrate having nominal crystalline planes and a top planar surface substantially parallel to said nominal planes;
   anisotropically etching a pair of V-shaped parallel grooves along said top planar surface forming a first plate between said parallel grooves, each of said V-shaped grooves having side walls lying substantially in the {111} monocrystalline planes;
   doping said first plate to form an n-type conductor region along said first plate;
   forming a p-epitaxial silicon layer over said grooved top planar surface;
   forming an n-epitaxial layer of doped silicon over said p-epitaxial layer following the contour of said grooved top planar surface to define a pair of V-shaped members opposite said pair of grooves and a second plate between said pair of V-shaped members;
   etching an opening through said n-epitaxial layer such that said second plate is connected to said n-epitaxial layer only through said pair of V-shaped members;
   applying a positive voltage to both said n-silicon substrate and said n-epitaxial layer with respect to said p-epitaxial layer;
   anisotropically etching said p-epitaxial layer to suspend said second plate and said pair of V-shaped members over said top planar surface; and
   coupling electronic detecting to both said first capacitive plate and said second capacitive plate to detect capacitive changes between said plates in response to the applied force.

* * * * *